US012568632B2

(12) United States Patent
Lai et al.

(10) Patent No.: US 12,568,632 B2
(45) Date of Patent: Mar. 3, 2026

(54) SEMICONDUCTOR DEVICE AND METHOD OF FORMING THE SAME

(71) Applicant: MACRONIX INTERNATIONAL CO., LTD., Hsinchu (TW)

(72) Inventors: Erh-Kun Lai, Taichung City (TW); Hsiang-Lan Lung, Kaohsiung City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 431 days.

(21) Appl. No.: 18/464,332

(22) Filed: Sep. 11, 2023

(65) Prior Publication Data

US 2025/0089269 A1 Mar. 13, 2025

(51) Int. Cl.
H10B 63/00 (2023.01)
H01L 23/522 (2006.01)

(52) U.S. Cl.
CPC ....... H10B 63/845 (2023.02); H01L 23/5226 (2013.01)

(58) Field of Classification Search
CPC ...... H10B 63/845; H10B 63/24; H10B 63/10; H10B 63/84; H01L 23/5226; H10N 70/231; H10N 70/8828
See application file for complete search history.

(56) References Cited

U.S. PATENT DOCUMENTS

| | | | |
|---|---|---|---|
| 10,497,752 B1 * | 12/2019 | Ando | .................. H10N 70/826 |
| 10,797,107 B2 | 10/2020 | Wu | |
| 11,647,682 B2 | 5/2023 | Lin et al. | |
| 2010/0270529 A1 | 10/2010 | Lung | |
| 2018/0277596 A1 | 9/2018 | Mori | |
| 2022/0028930 A1 | 1/2022 | Wu et al. | |
| 2022/0093861 A1 | 3/2022 | Givens et al. | |
| 2024/0215241 A1 * | 6/2024 | Xiao | .................. H01L 25/0657 |

FOREIGN PATENT DOCUMENTS

| | | |
|---|---|---|
| CN | 104871313 A | 8/2015 |
| CN | 108040501 A | 5/2018 |
| CN | 111373533 A | 7/2020 |
| CN | 113437070 A | 9/2021 |
| TW | 201937770 A | 9/2019 |
| TW | 202111926 A | 3/2021 |
| TW | 202212605 A | 4/2022 |
| TW | 202245248 A | 11/2022 |

* cited by examiner

*Primary Examiner* — Karen Kusumakar

(74) *Attorney, Agent, or Firm* — McClure, Qualey & Rodack, LLP

(57) ABSTRACT

A semiconductor device includes a stack and a plurality of vertical pillar structures disposed in the stack. The stack includes a plurality of insulating layers and a plurality of conductive layers alternately arranged, each of the conductive layers includes a center portion and a plurality of edge portions at edges of the center portion, wherein a resistance of a material of the edge portions is less than a resistance of a material of the center portion. Each of the vertical pillar structures includes a conductive core, a shell electrode on a sidewall of the conductive core, and an ovonic threshold switch (OTS) layer on a sidewall of the shell electrode. A method of forming the semiconductor device is also disclosed.

20 Claims, 14 Drawing Sheets

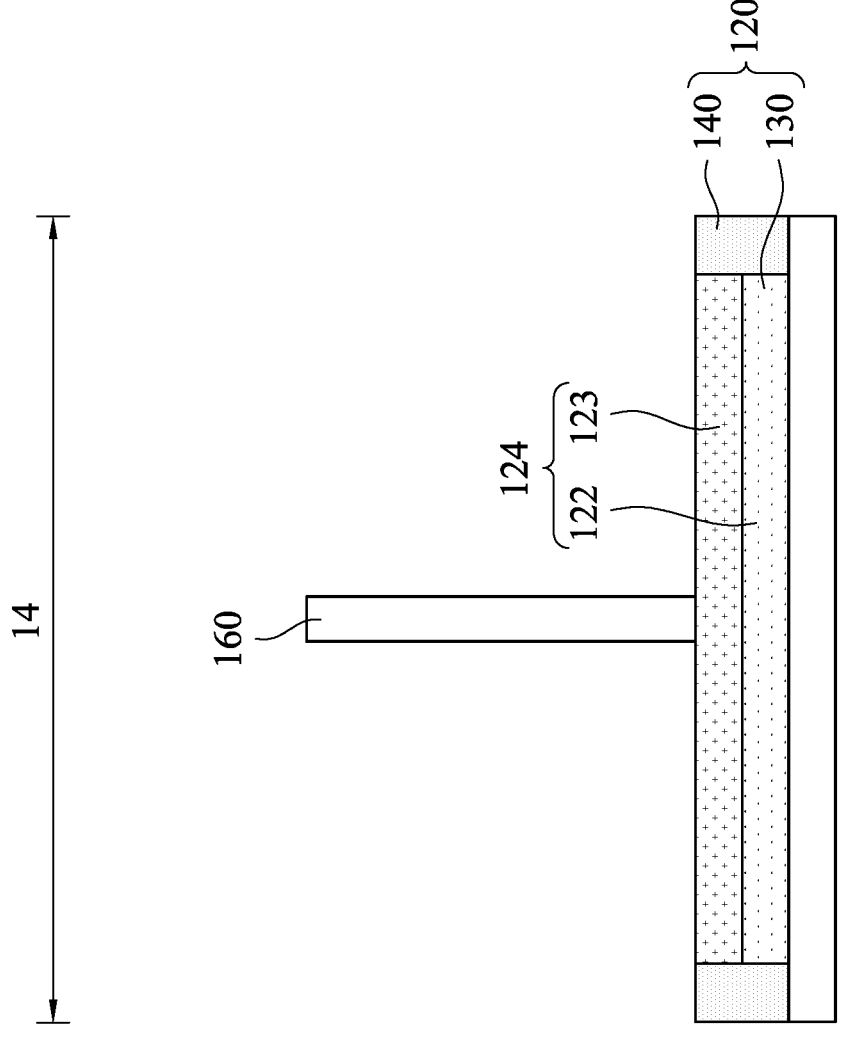
Fig. 4

Fig. 8

SEMICONDUCTOR DEVICE AND METHOD OF FORMING THE SAME

BACKGROUND

Field of Invention

The present disclosure relates to a semiconductor device and a method of forming the same.

Description of Related Art

In recent years, the structures of semiconductor devices have been changed constantly, and the storage capacity of the devices has been increased continuously. Memory devices are used in storage elements for many products such as digital cameras, mobile phones, computers, etc. As the application increases, the demand for the memory device focuses on small size and large memory capacity. For satisfying the requirement, a memory device having a high element density and a small size and the manufacturing method thereof are in need.

In order to increase a storage capacity of the memory in a limited memory volume, a three dimensional (3D) memory is developed. In some 3D memory technologies, vertical channel structures may be disposed in blocks arranged in rows. For each block, a plurality of horizontal word lines is formed by stacking planar word line layers that intersect with the vertical channel structures in the block, forming so-called gate-all-around memory cells.

SUMMARY

An aspect of the disclosure provides a semiconductor device. The semiconductor device includes a stack and a plurality of vertical pillar structures disposed in the stack. The stack includes a plurality of insulating layers and a plurality of conductive layers alternately arranged, each of the conductive layers includes a center portion and a plurality of edge portions at edges of the center portion, wherein a resistance of a material of the edge portions is less than a resistance of a material of the center portion. Each of the vertical pillar structures includes a conductive core, a shell electrode on a sidewall of the conductive core, and an ovonic threshold switch (OTS) layer on a sidewall of the shell electrode.

In some embodiments, the center portions are conductive and are directly in contact with the OTS layers of the vertical pillar structures.

In some embodiments, each of the center portions continuously extends between the vertical pillar structures.

In some embodiments, the material of the center portions includes TiN, carbon, graphene, doped carbon, W, WN, or TaN.

In some embodiments, the material of the edge portions includes TiN, TaN, Co, $CoSi_x$, Ni, $NiSi_x$, Ru, W, WN, or combinations thereof.

In some embodiments, a resistance of a material of the conductive core is less than a resistance of a material of the shell electrode.

In some embodiments, the material of the shell electrode includes TiN, carbon, graphene, doped carbon, W, WN, or TaN.

In some embodiments, the material of the conductive core includes TiN, W, Al, Cu, TaN, Ru, Co, or combinations thereof.

In some embodiments, a sidewall of each of the OTS layer is directly and continuously in contact with side surfaces of the insulating layers and the center portions of the conductive layers.

In some embodiments, the stack includes an array region and a stair case region extended from the array region, and lengths of the conductive layers and the underlying insulating layers are sequentially decrease from bottom to top at the stair case region in a first direction.

In some embodiments, the edge portions extend in the first direction at opposite sides of the center portion of each of the conductive layer.

In some embodiments, a thickness of each of the center portions at the stair case region is thicker than a thickness of each of the center portions at the array region.

In some embodiments, the semiconductor device further includes a plurality of contacts connected to the center portions at the stair case region, respectively, wherein ends of the contacts are embedded in the center portions.

In some embodiments, the edge portions encircle the center portion.

In some embodiments, the edge portions further extends into the center portion.

Another aspect of the disclosure provides a method of forming a semiconductor device, the method includes following steps. A stack including a plurality of insulating layers and a plurality of first conductive material layers alternately arranged is formed. A vertical pillar structure is formed in an array region of the stack. The vertical pillar structure includes a conductive core, a shell electrode on a sidewall of the conductive core, and an ovonic threshold switch (OTS) layer on a sidewall of the shell electrode. Edge portions with a second conductive material are formed adjacent sidewalls of the first conductive material layers, wherein a resistance of the second conductive material is lower than a resistance of the first conductive material layers.

In some embodiments, the method further includes selectively growing a plurality of landing pad portions on the first conductive material layers at the stair case region, and forming a plurality contacts on the landing pad portions at the stair case region, respectively.

In some embodiments, the material of the first conductive material layers includes TiN, carbon, graphene, doped carbon, W, WN, or TaN.

In some embodiments, the material of the second conductive material includes TiN, TaN, Co, $CoSi_x$, Ni, $NiSi_x$, Ru, W, WN, or combinations thereof.

In some embodiments, the method further includes removing protruding portions of the second conductive material such that side surfaces of remaining portions of the second conductive material align with side surfaces of the insulating layers.

According to the embodiments of the disclosure, the formation of the semiconductor device includes depositing the first conductive material layers in the stack with the insulating layers, and the first conductive material layers are not entirely replaced by the second conductive material. More particularly, only the portions of the first conductive material layers at edges are replaced by the second conductive material. The difficulty of forming the conductive layers of the gate structures of the semiconductor device is reduced, and the overall resistance of the conductive layers is also reduced by adding the second conductive material having lower resistance.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

In the drawings,

FIG. 4 is a cross-sectional view taken along line C-C in FIG. 1;

FIG. 5 to FIG. 11 are cross-sectional vires of different stages of a method of forming a semiconductor device according to some embodiments of the disclosure;

DESCRIPTION OF THE EMBODIMENTS

Figure 1:
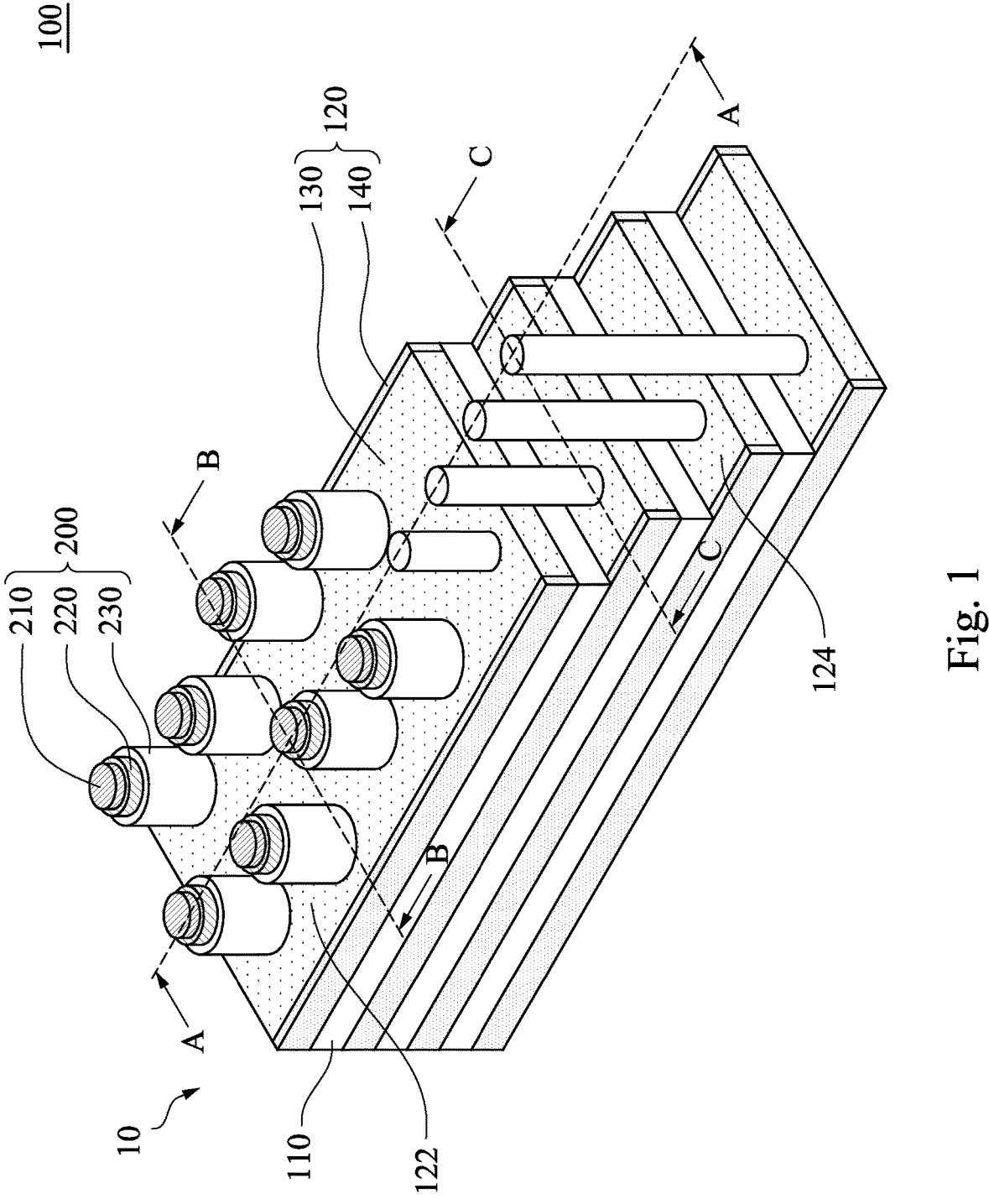
FIG. 1 is an oblique view of a block of a semiconductor device according to some embodiments of the disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
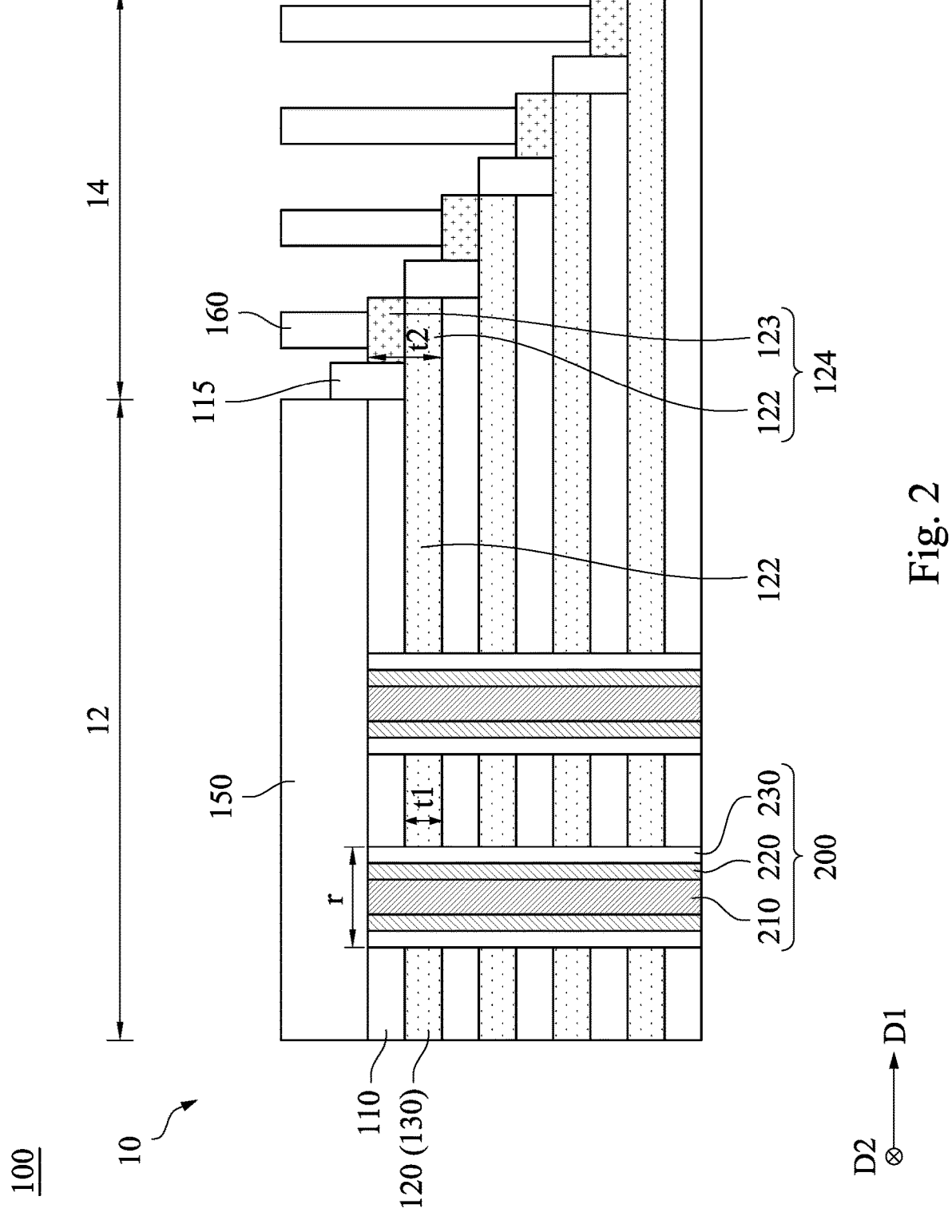
FIG. 2 is a cross-sectional view taken along line A-A in FIG. 1.
Figure 3:
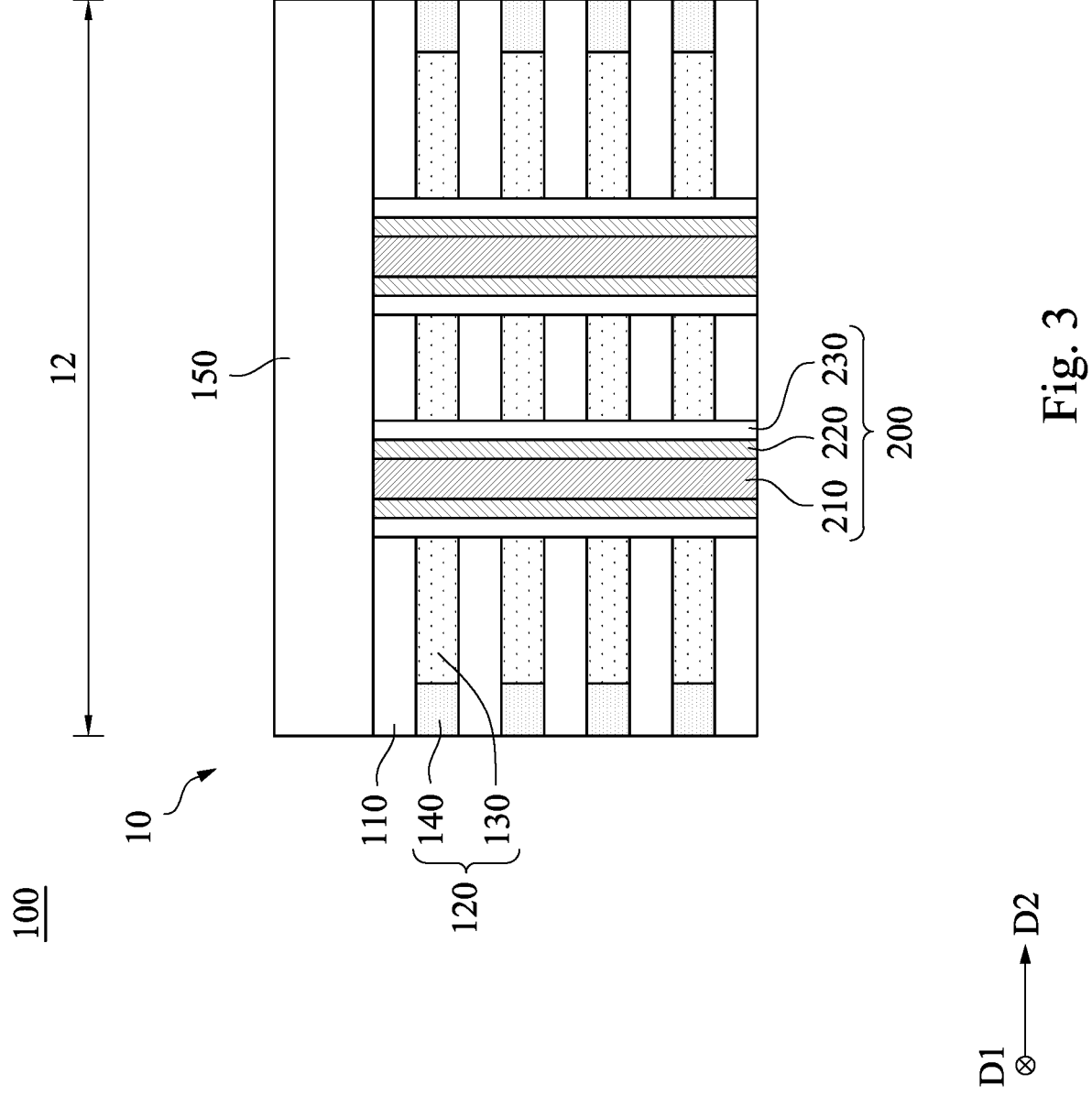
FIG. 3 is a cross-sectional view taken along line B-B in FIG. 1.

Reference is made to FIG. 1 to FIG. 4, in which FIG. 1 is an oblique view of a block of a semiconductor device according to some embodiments of the disclosure; FIG. 2 is a cross-sectional view taken along line A-A in FIG. 1; FIG. 3 is a cross-sectional view taken along line B-B in FIG. 1; and FIG. 4 is a cross-sectional view taken along line C-C in FIG. 1. Please note that some of the elements are hidden in FIG. 1 for the drawing clarity.

The semiconductor device 100 relates to gate-all-around (GAA) memory cells, especially to ovonic threshold switch (OTS) memory cells. The semiconductor device 100 includes a plurality of insulating layers 110 and a plurality of conductive layers 120 alternately arranged as a stack, and a plurality of vertical pillar structures 200 penetrating the stack of the insulating layers 110 and the conductive layers 120.

The block 10 of the semiconductor device 100 includes an array region 12 and a stair case region 14. The vertical pillar structures 200 are arranged in the array region 12. Each of the vertical pillar structures 200 includes a conductive core 210, a shell electrode 220 wrapping a sidewall of the conductive core 210, and an ovonic threshold switch (OTS) layer 230 wrapping a sidewall of the shell electrode 220. In some embodiments, the conductive core 210 has a circular cross-section in the top view, and the shell electrode 220 and the OTS layer 230 have a ring shape cross-section in the top view.

The conductive layers 120 extend from the array region 12 to the stair case region 14. The lengths of the conductive layers 120 and the underlying insulating layers 110 are sequentially decrease from bottom to top to form the stair case region 14. The conductive layers 120 at the array region 12 serve as word planes 122 to the vertical pillar structures 200, and the conductive layers 120 at the stair case region 14 serve as landing pads 124 for interconnection.

Each of the conductive layers 120 includes a center portion 130 and a plurality of edge portions 140. The center portion 130 encircles the vertical pillar structures 200 and is continuous between the vertical pillar structures 200. The edge portions 140 are disposed on side surfaces of the center portion 130. The material of the edge portions 140 of the conductive layer 120 is different from the material of the center portion 130 of the conductive layer 120. For example, the resistance of the material of the edge portions 140 is less than the resistance of the material of the center portion 130.

As shown in FIG. 2, the lengths of the insulating layers 110 and the conductive layer 120 are varied in a first direction D1. The edge portion 140 is not formed on a second direction D2 which is perpendicular to the first direction D1. As shown in FIG. 3 and FIG. 4, the edge portions 140 are formed at the opposite edges of the array region 12 and the stair case region 14 in the first direction D1.

The semiconductor device 100 further includes a cap layer 150 disposed on the array region 12 to seal the memory cells. The semiconductor device 100 further includes a plurality of contacts 160 disposed at the stair case region 14. The contacts 160 are connected to the landing pads 124, respectively.

Optionally, in some embodiments, in order to prevent the unwanted punch through issue raised to the conductive layer 120 when the openings of the forming the contacts 160 are formed, additional landing pad portions 123 are made on the word planes 122 at the stair case region 14, such that the thickness t1 of the landing pads 124 at the stair case region 14 is thicker than t the thickness t2 of the word planes 122 at the stair array region 12.

The semiconductor device 100 is a 3D OTS type memory device. The OTS type memory device is a current device which requires current to flow between the vertical pillar structures 200 and the conductive layers 120. The set/reset current to the semiconductor device 100 is related to the contact area between the vertical pillar structures 200 and the conductive layers 120. The more contact area it is, the more set/reset current it needs.

For example, the contact area of an individual memory cell can be presented as $\pi \times r \times t1$, in which r is a diameter of each vertical pillar structure 200, and t1 is a thickness of each conductive layer 120 at the array region 12. For 3D OTS type memory device, as scaling down, a smaller contact area is preferred to reduce operation current. Therefore, a thinner thickness t1 is preferred in the 3D OTS type memory device to reduce the operation current as scaling down.

In a conventional gate replacement process of forming the conductive layers, a stack of insulating layers and sacrificial layers are alternately formed, and the sacrificial layers are replaced by the conductive material after the vertical pillar structures are formed. However, the thickness t1 of each of the conductive layers 120 at the array region 12 of the embodiments of the semiconductor device 100 of the present disclosure becomes thinner and thinner, for example, 10 nm, 5 nm, or 3 nm, and thus the conductive layers 120 are hard to be formed by the conventional replacement process.

Therefore, the conductive layers 120 of the semiconductor device 100 of some embodiments of the present disclosure are made by a partial replacement process, and each of the conductive layers 120 includes the center portion 130 and the edge portions 140, in which the material of the edge portions 140 is different from the material of the center portion 130.

Figure 5:
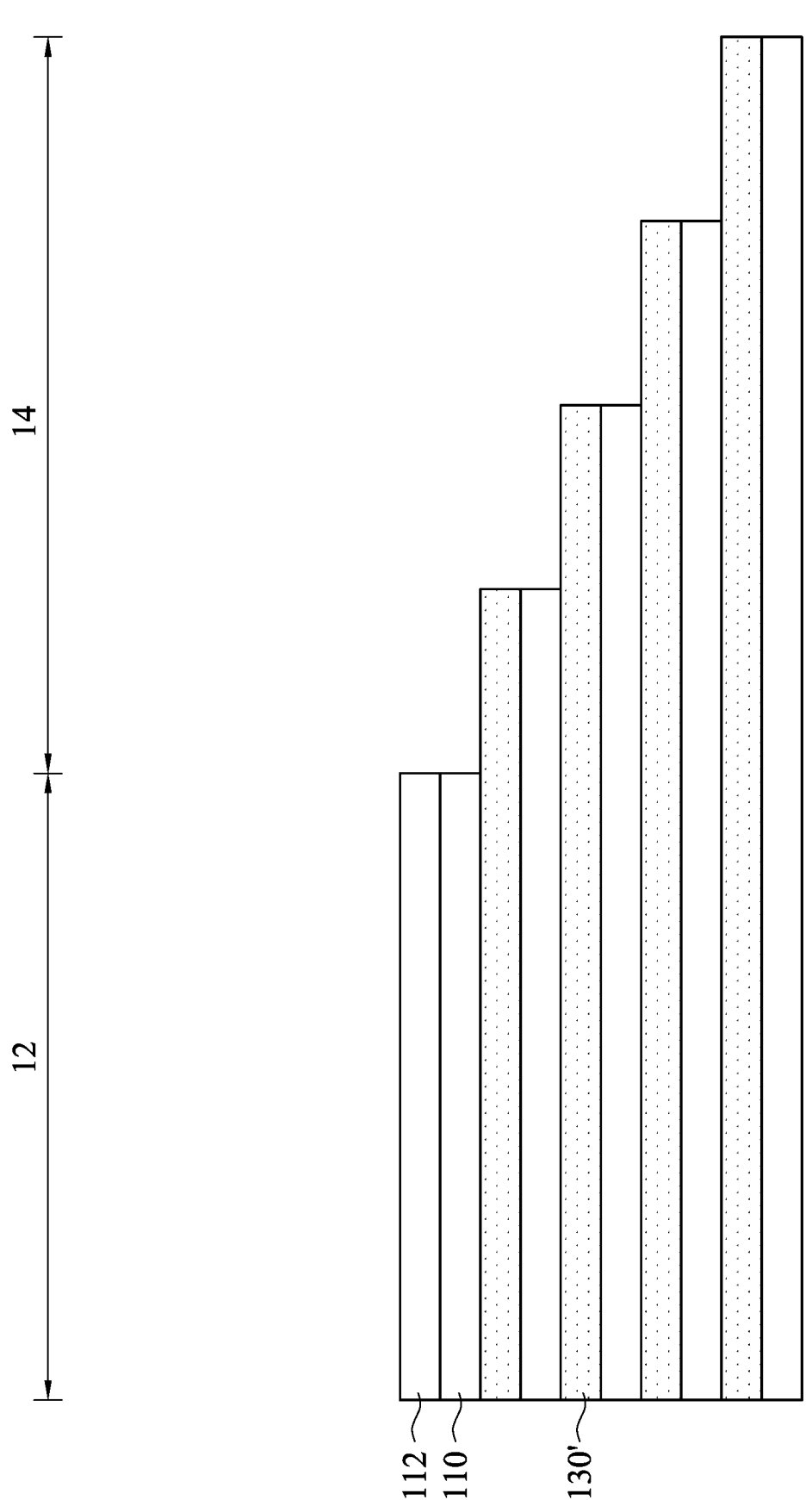

Reference is made to FIG. 5 to FIG. 11, which are cross-sectional vires of different stages of a method of forming a semiconductor device according to some embodiments of the disclosure. As shown in FIG. 5, the cross-section of FIG. 5 is taken along line A-A in FIG. 1. A stack including a plurality of insulating layers 110 and a plurality of first conductive material layers 130' alternately arranged are formed. The stack includes an array region 12 and a stair case region 14. The lengths of the first conductive material layers 130' and the underlying insulating layers 110 are sequentially decrease from bottom to top thereby forming the stair case region 14.

The material of the insulating layers 110 can be an oxide such as silicon oxide. The material of the first conductive material layers 130' is chosen to have good interface performance with the vertical pillar structures 200 (as shown in FIG. 1) and is not easily being affected during the formation of the vertical pillar structures 200. For example, the material of the first conductive material layers 130' can be TiN, carbon, graphene, doped carbon, W, WN, or TaN.

In some embodiments, the stack of the insulating layers 110 and the first conductive material layers 130' is formed on a substrate such as a silicon substrate. In some other embodiments, the stack of the insulating layers 110 and the first conductive material layers 130' is formed on a substrate having a plurality of semiconductor components, such as a plurality of complementary metal-oxide-semiconductor (CMOS) components and other suitable circuits.

Figure 6:
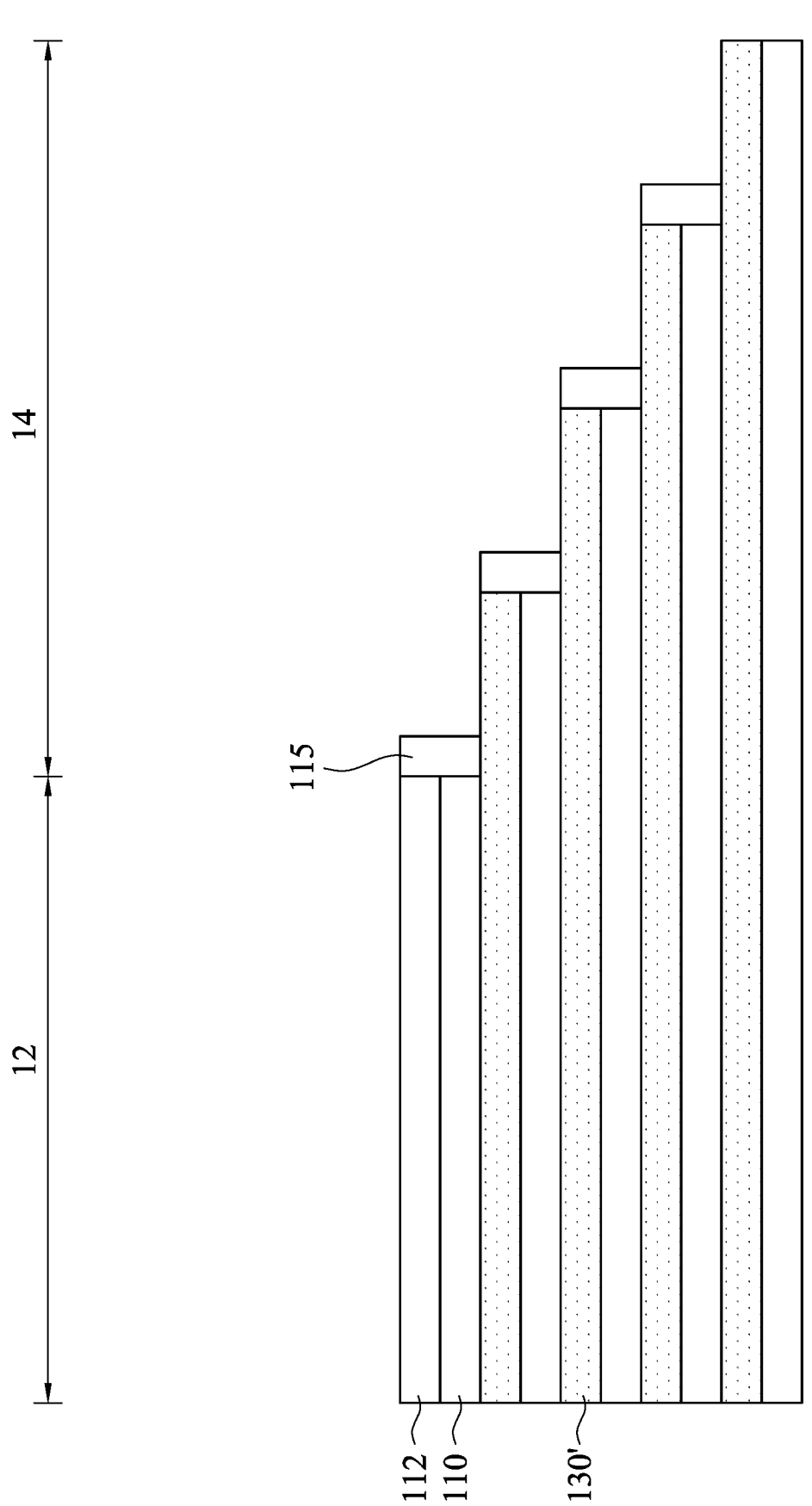

As shown in FIG. 6, the array region 12 is protected by a hard mask layer 112, and a plurality of dielectric spacers 115 are formed on sidewalls of the pairs of the insulating layers 110 and the first conductive material layers 130', respectively. Each of the dielectric spacers 115 is in contact with the sidewalls of the insulating layer 110 and its upper material layer. For example, the uppermost dielectric spacer 115 is in contact with the sidewalls of the uppermost insulating layer 110 and the hard mask layer 112, and the rest of dielectric spacers 115 are in contact with the sidewalls of the rest insulating layer 110 and the first conductive material layers 130' above.

It is noted that the first conductive material layers 130' at the stair case region 14 have portions uncovered by the dielectric spacers 115. The dielectric spacers 115 are made of a dielectric material such as SiN. In some embodiments, the dielectric spacers 115 are formed by depositing a dielectric layer and then performing an etch back process such as a reactive ion etching (RIE) process to define the dielectric spacers 115.

Figure 7:
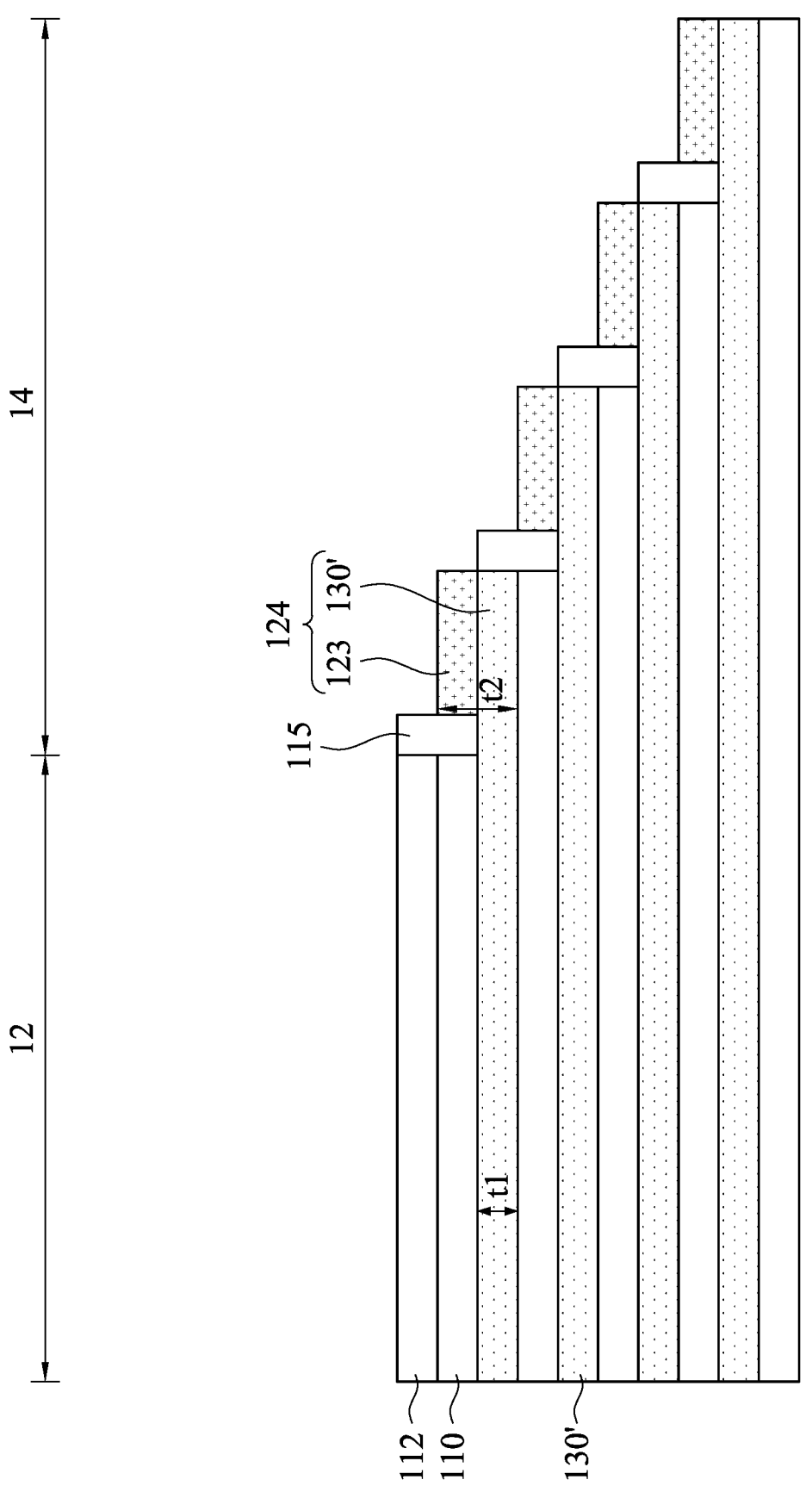

Then, as shown in FIG. 7, a selectively growth process is performed to grow landing pad portions 123 on the first conductive material layers 130' at the stair case region 14. Due to the setting of the selectively growth process, the landing pad portions 123 only grows on the first conductive material layers 130', not on the dielectric spacers 115. Namely, the dielectric spacers 115 laterally isolate the first conductive material layers 130' and the landing pad portions 123 adjacent on a plane. The first conductive material layers 130' at the stair case region 14 and the landing pad portions 123 thereon are together referred as landing pads 124. The thickness t2 of each of the landing pads 124 is thicker than the thickness t1 of each of the first conductive material layers 130' at the array region 12.

In some embodiments, the material of the landing pad portions 123 can be the same as or different from the material of the first conductive material layers 130'. For example, the material of the first conductive material layers 130' can be carbon, and the material of the landing pad portions 123 can be carbon, TiN, TaN, or tungsten. As well as the material of the landing pad portions 123 can be selectively grown on the material of the first conductive material layers 130'. The hard mask layer 112 can be removed after the landing pad portions 123 are formed.

Figure 8:
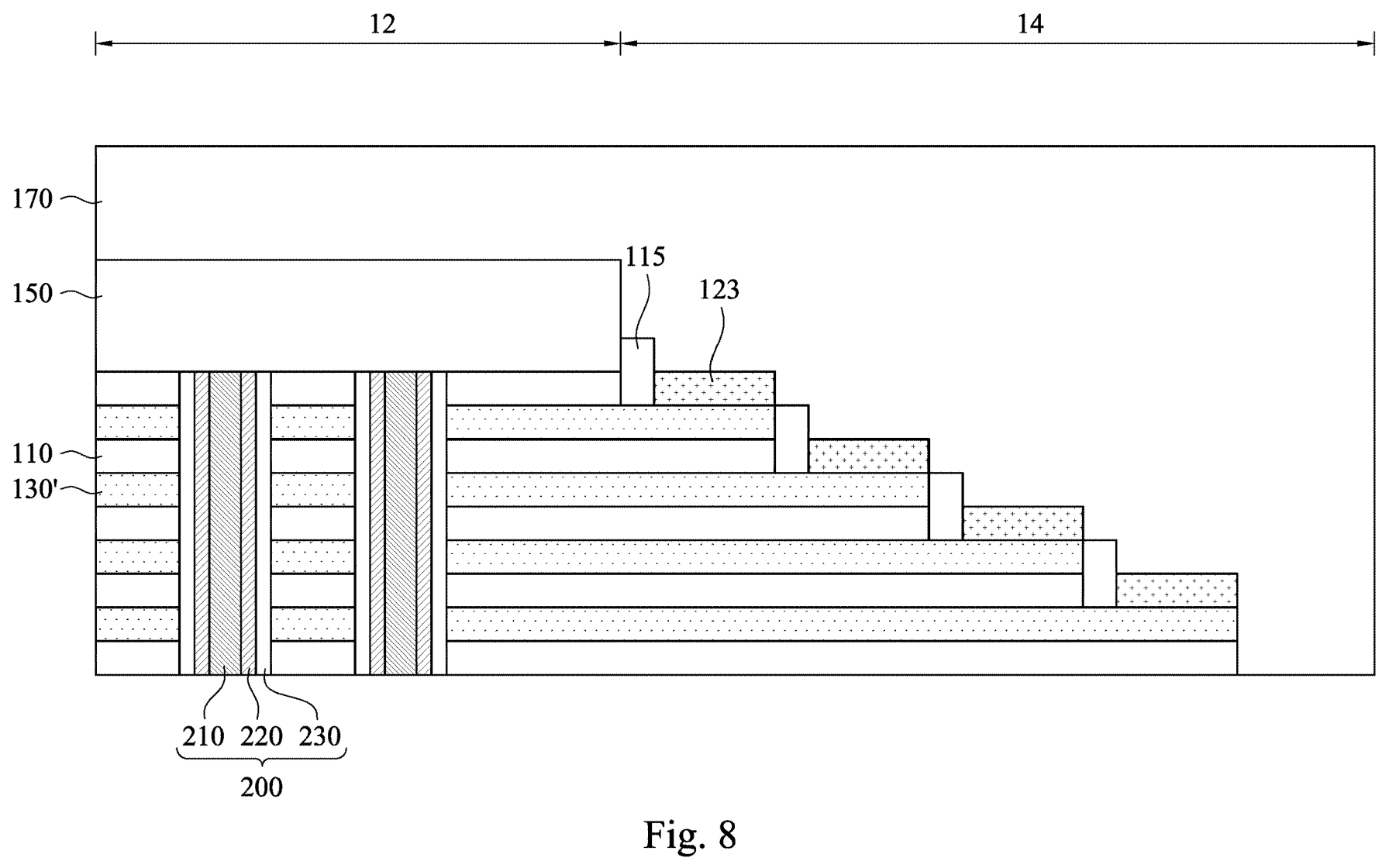

Reference is made to FIG. 8, which is taken along line A-A in FIG. 1. A plurality of vertical pillar structures 200 are formed in the array region 12 of the stack. The formation of the vertical pillar structures 200 includes forming a plurality of holes in the array region 12 of the stack, and then an OTS material is conformally deposited on the sidewalls of the holes. An electrode material is then conformally deposited on the OTS material, and a conductive material is further deposited to fill the holes. In some embodiments, the holes are completely filled by the conductive material, without any seam therein.

The formation of the vertical pillar structures 200 further includes performing a planarization process to remove the exceeded portions of the conductive material, the electrode material, and the OTS material. The planarization process can be a chemical mechanical polishing (CMP) process and stops at the topmost insulating layer 110. Thus the vertical pillar structures 200 are defined in the array region 12 after the planarization process is performed, in which each of the vertical pillar structures 200 includes a conductive core 210 made of the conductive material, a shell electrode 220 made of the electrode material, and an OTS layer 230 made of the OTS material. A cap layer 150 is deposited on the vertical pillar structures 200 and the topmost insulating layer 110 to seal the memory array. A dielectric layer 170 is deposited over the cap layer 150 and the stack including the array region 12 and the stair case region 14.

The material of the OTS layer 230 includes chalcogenide material selected for use as an ovonic threshold switch, such as $As_2Se_3$, ZnTe, or GeSe. In some embodiments, the material of the OTS layer 230 can include a chalcogenide in combination with one or more elements from the group consisting of Te, Se, Ge, Si, As, Ti, S, Sb, and combinations thereof.

The material of the shell electrode 220 is different from the material of the conductive core 210. More particularly, the material of the shell electrode 220 is also conductive, and the material of the conductive core 210 has a resistance less than the material of the shell electrode 220.

For example, the material of the conductive core 210 includes TiN, W, Al, Cu, TaN, Ru, Co, or combinations thereof. The material of the shell electrode 220 is selected to have good interface performance between the OTS layer 230 and the conductive core 210. For example, the material of the shell electrode 220 includes TiN, carbon, graphene, doped carbon, W, WN, or TaN.

In each of the vertical pillar structures 200, the shell electrode 220 is directly and continuously in contact with the sidewall of the conductive core 210, and the OTS layer 230 is directly and continuously in contact with the sidewall of the shell electrode 220.

Figure 9:
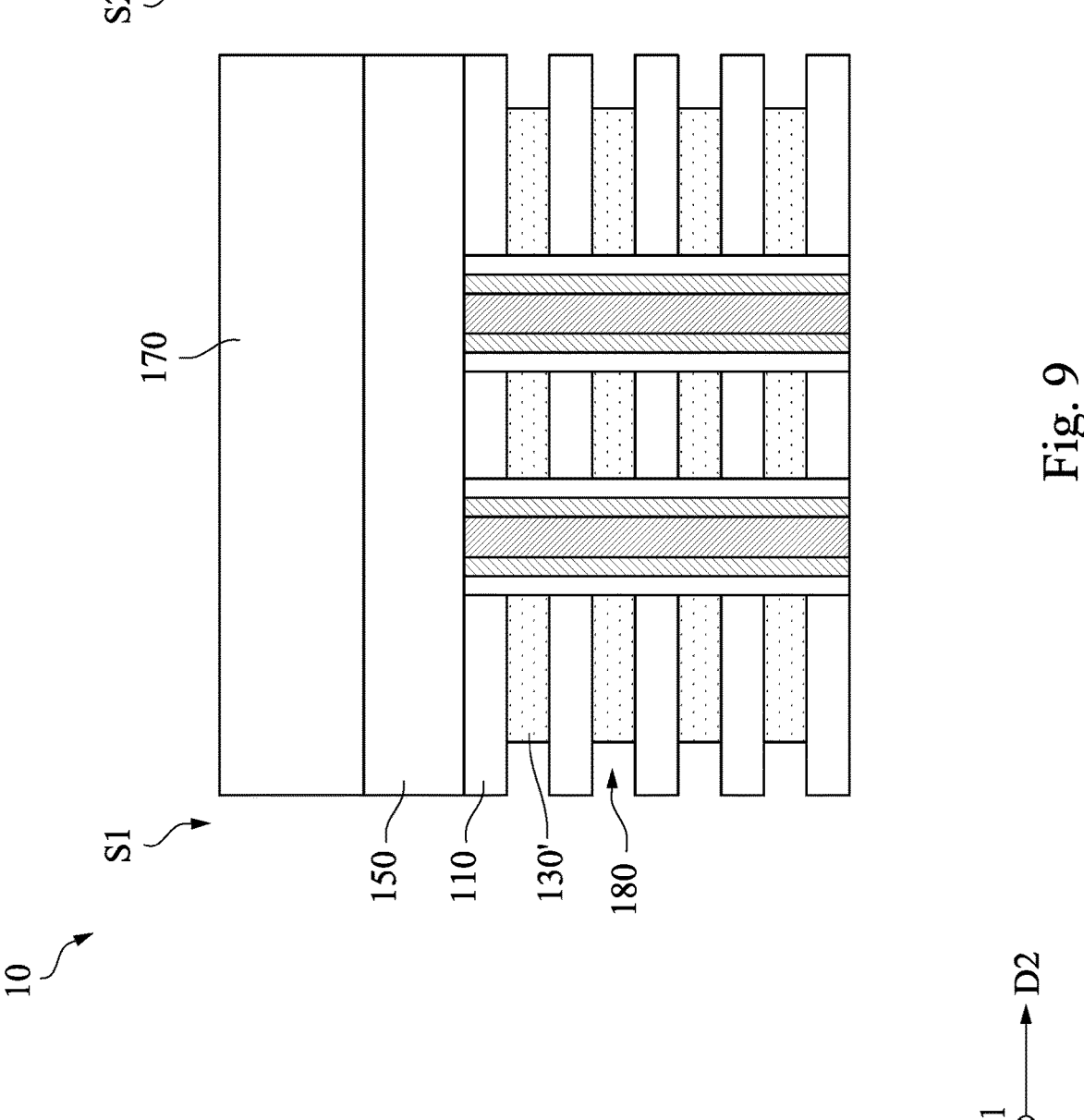

Reference is made to FIG. 9, in which FIG. 9 is a cross-sectional view taken along line B-B in FIG. 1. A plurality of slits S1, S2 are formed in the structure of FIG. 8 to define a block 10 of the semiconductor device. Then a removal process is performed to partially remove portions of the first conductive material layers 130' exposed by the slits S1, S2. More particularly, the removal process is a selective etching process which has a high etching selectivity between the insulating layers 110 and first conductive material layers 130'. Thus the side surfaces of the first conductive material layers 130' are recessed from the side surfaces of the insulating layers 110 after removal process. In some embodiments, the side surfaces of the first conductive material layers 130' are flat surfaces after the removal process is performed. In some other embodiments, the side surfaces of the first conductive material layers 130' are concave surfaces or convex surfaces after the removal process is performed. A plurality of cavities 180 are formed at the edges of the first conductive material layers 130' after the removal process is performed.

In some embodiments, the lengths of the insulating layers 110 and the first conductive material layers 130' are varied in a first direction D1. The slits S1 and S2 are formed at opposite sides of the block 10, and the slits S1 and S2 are extended along the first direction D1. The slits S1 and S2 are formed cut through the array region 12 and the stair case region 14.

Figure 10:
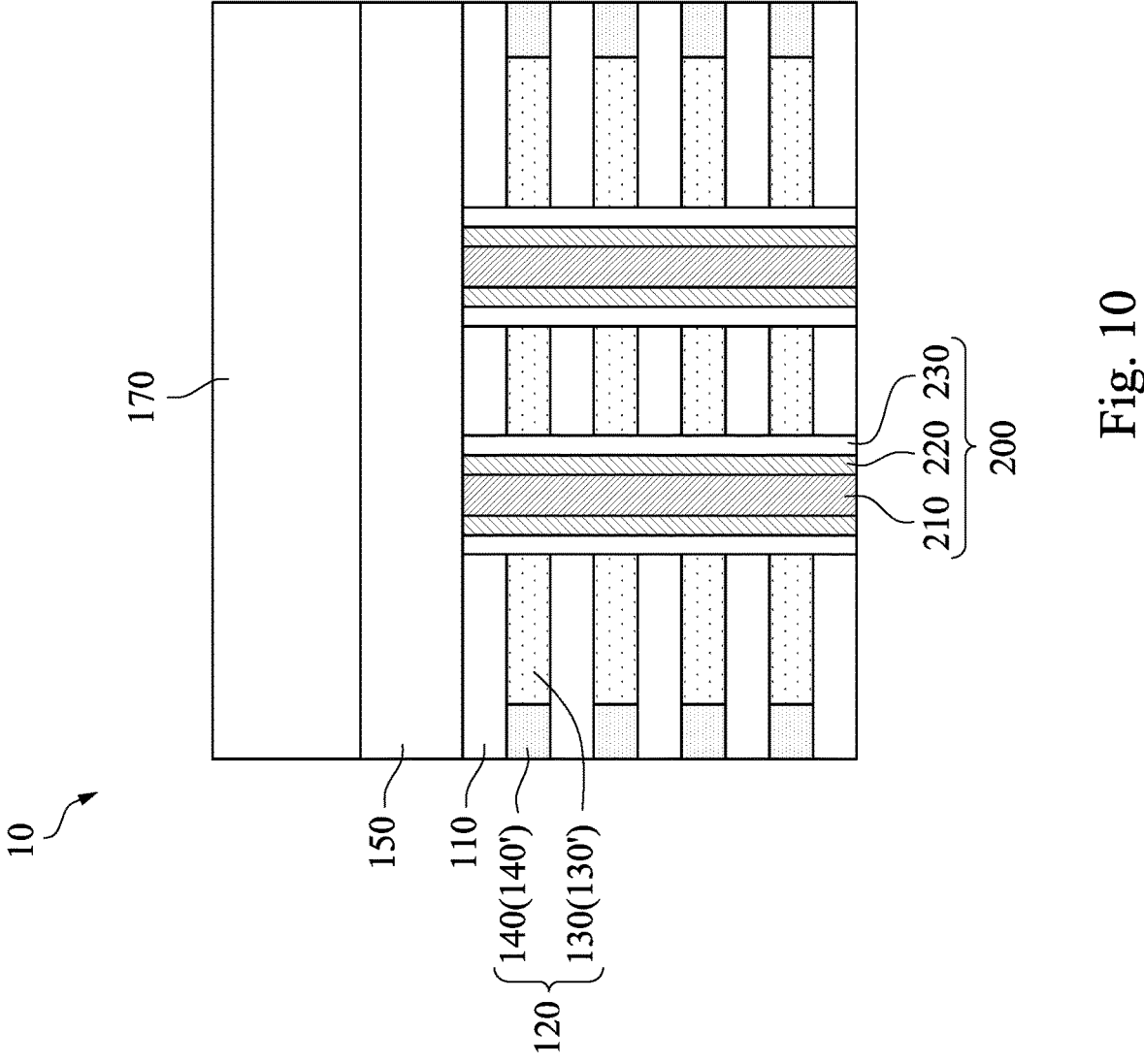

Reference is made to FIG. 10. FIG. 10 is a cross-sectional view taken along line B-B in FIG. 1. A second conductive material 140' is deposited in the cavities 180 (as shown in FIG. 9) and on the side surfaces of the insulating layers 110, and then an anisotropic etching process such as a reactive ion etching (RIE) process is performed to remove the protruding portions of the second conductive material 140', such that the side surfaces of the remaining portions of the second conductive material 140' align with the side surfaces of the insulating layers 110. The remaining portions of the second conductive material 140' are located at the edges of the first conductive material layers 130'.

The material of the second conductive material 140' is different from the material of the first conductive material layers 130'. For example, the material of the second conductive material layers 140' has a resistance lower than that of the material of the first conductive material layers 130'. For example, the material of the second conductive material 140' includes TiN, TaN, Co, $CoSi_x$, Ni, $NiSi_x$, Ru, W, WN, or combinations thereof. The edge portions 140 of the conductive layers 120 are made of material having low resistance to reduce the overall resistance of the conductive layers 120.

The first conductive material layers 130' have been recessed and are located at the center of the conductive layers 120, therefore, the first conductive material layers 130' are also regarded as the center portions 130 of the conductive layers 120. The remained portions of the second conductive material 140' are located at the edges of the conductive layers 120, therefore, the remained portions of the second conductive material 140' are also regarded as the edge portions 140 of the conductive layers 120. The edge portions 140 are formed adjacent the sidewalls of the first conductive material layers 130'. The sidewall of OTS layer 230 of each vertical pillar structure 200 is directly and continuously in contact with side surfaces of the insulating layers 110 and the center portions 130. The conductive layers 120 including the center portions 130 and the edges portions 140 serve as gate structures to the vertical pillar structures 200 thereby forming gate-all-around memory cells.

Details of the partial replacement process to form the conductive layers 120 of the semiconductor device 100 of some embodiments of the present disclosure are described in FIG. 9 and FIG. 10. The first conductive material layers 130' are initially deposited in the stack with the insulating layers 110, and the first conductive material layers 130' are not entirely replaced by the second conductive material 140'. More particularly, only the portions of the first conductive material layers 130' at edges are replaced by the second conductive material 140'. The difficulty of forming the conductive layers 120 is reduced, and the overall resistance of the conductive layers 120 is also reduced by adding the second conductive material 140' having lower resistance.

Figure 11:
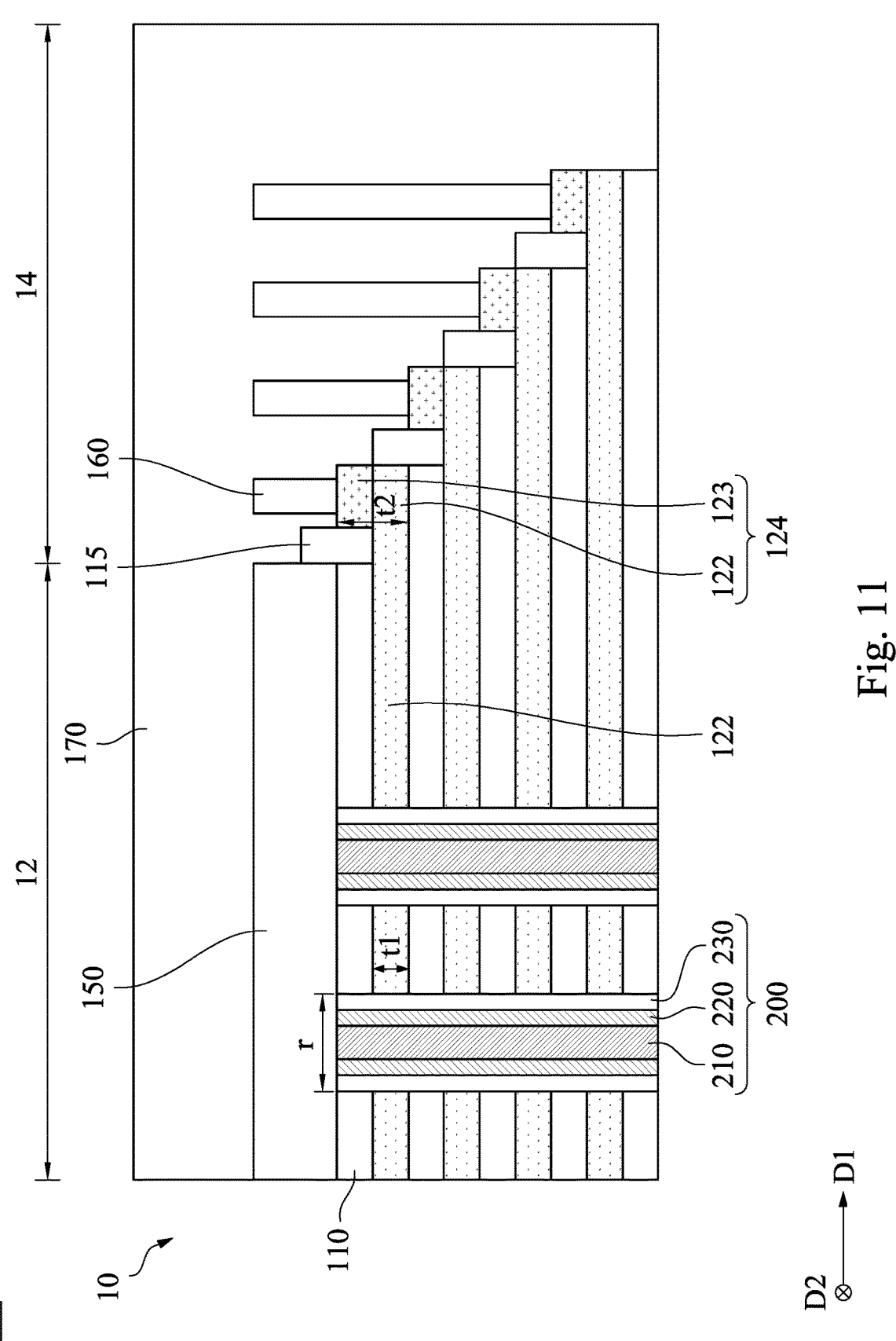

Reference is made to FIG. 11, which is a cross-sectional view taken along line A-A in FIG. 1. A plurality of contacts 160 are formed to land on the stair case region 14. The contacts 160 are connected to the landing pads 124 (e.g. the landing pad portions 123) of the conductive layers 120 at the stair case region 14, respectively. In some embodiments, the landing pads 124 at the stair case region 14 have a thicker thickness T2 to ensure the electrical connection between the contacts 160 and the landing pads 124. The thicker landing pads 124 can also prevent from being unwanted punched through of the formation of the contacts 160.

Figure 12:
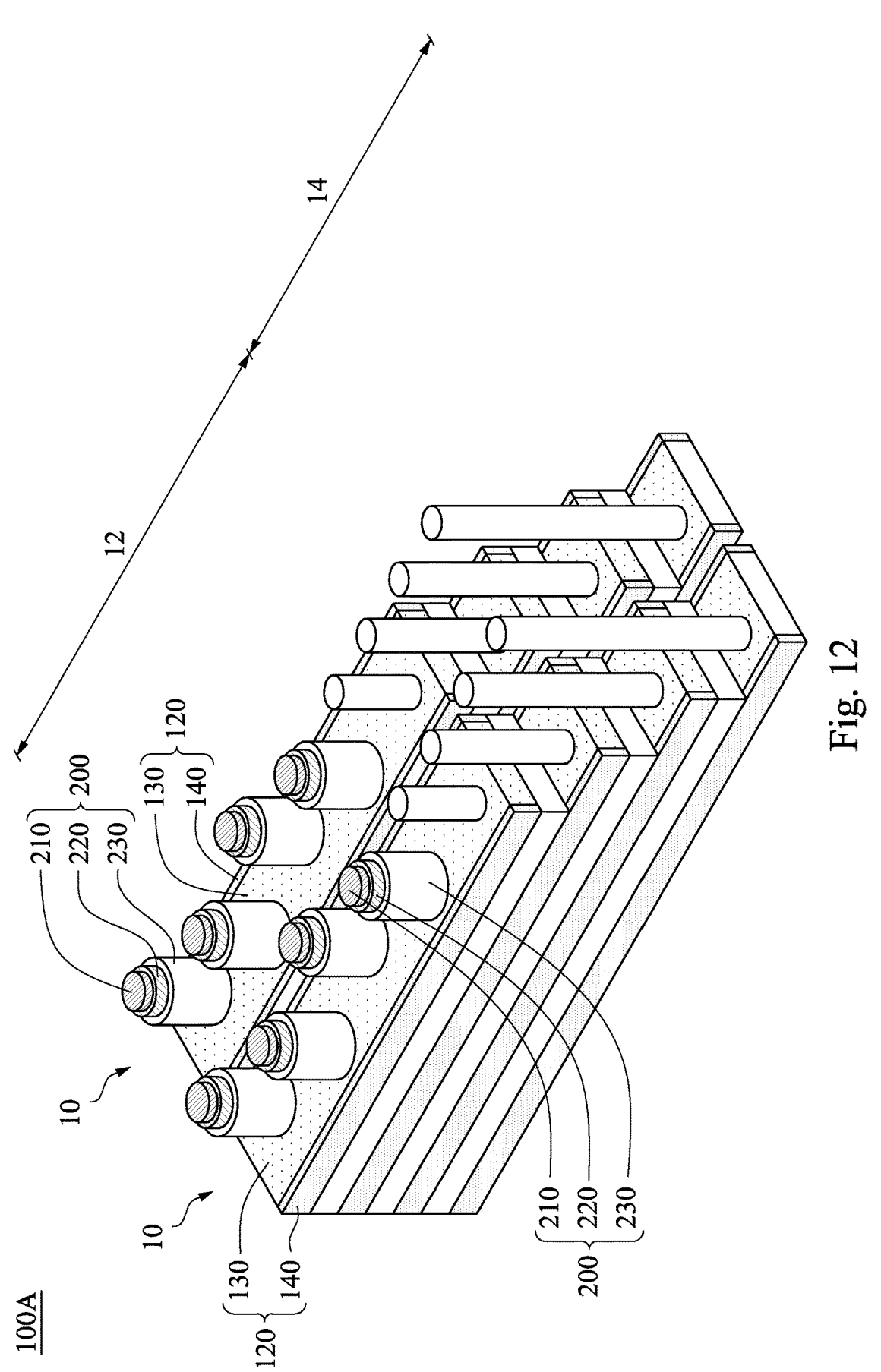
FIG. 12 is an oblique view of a semiconductor device according to some other embodiments of the disclosure.

Reference is made to FIG. 12, which is an oblique view of a semiconductor device according to some other embodiments of the disclosure. The semiconductor device 100A includes a plurality of blocks 10. Each of the conductive layers 120 of the blocks 10 has the center portion 130 and a plurality of the edge portions 140 at the edges of the center portion 130, in which the resistance of the edge portions 140 is lower than the resistance of the center portion 130. The center portion 130 is also conductive and is directly contact with the OTS layers 230 of the vertical pillar structures 200. In some embodiments, the stair case regions 14 of the blocks 10 can be individual or integrated.

Figure 13:
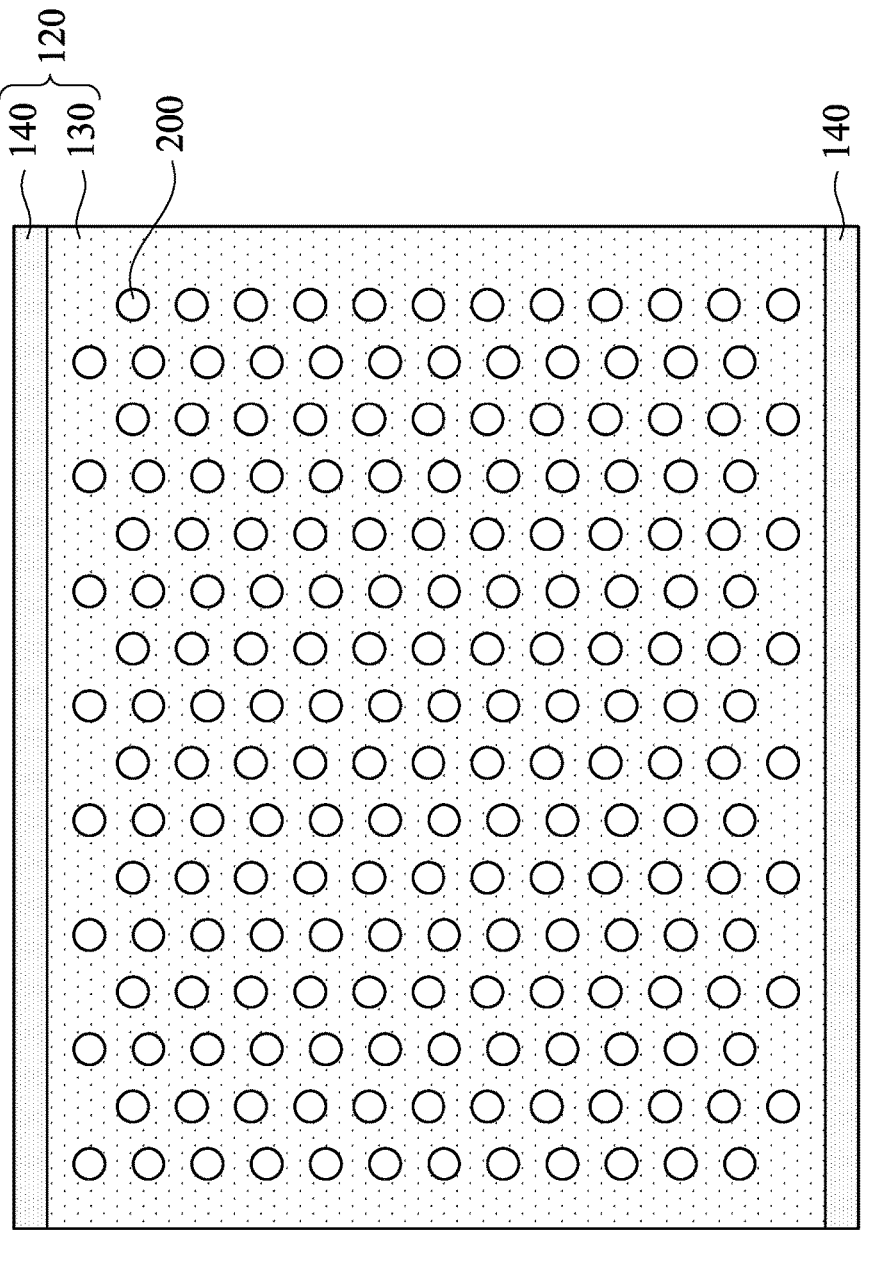
FIG. 13 and FIG. 14 are schematic top views of one of conductive layer of a block of a semiconductor device according to different embodiments of the disclosure.
Figure 14:
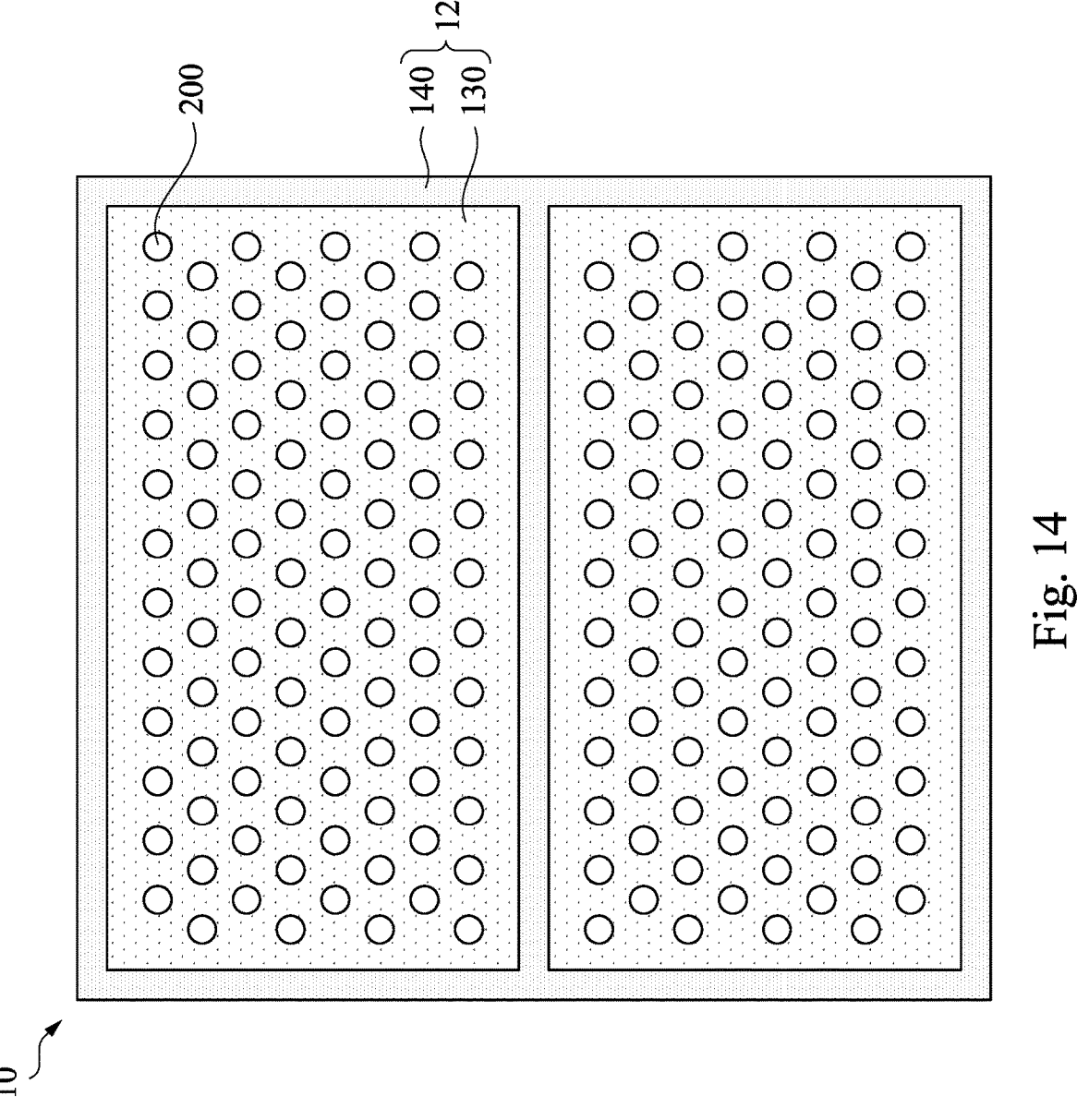

Reference is made to FIG. 13 and FIG. 14. FIG. 13 and FIG. 14 are schematic top views of one of conductive layer of a block of a semiconductor device according to different embodiments of the disclosure. As shown in FIG. 13, the block 10 is a rectangular shape, and the edge portions 140 are located to two opposite sides of the center portion 130. Alternatively, as shown in FIG. 14, the block 10 is a rectangular shape, and the edge portions 140 are located at four edges of the center portion 130 and encircle the center portion 130. Additionally, in some embodiments, the edge portions 140 further extend into the center portion 130 of the conductive layer 120, as shown in FIG. 14.

According to the embodiments of the disclosure, the formation of the semiconductor device includes depositing the first conductive material layers in the stack with the insulating layers, and the first conductive material layers are not entirely replaced by the second conductive material. More particularly, only the portions of the first conductive material layers at edges are replaced by the second conductive material. The difficulty of forming the conductive layers of the gate structures of the semiconductor device is reduced, and the overall resistance of the conductive layers is also reduced by adding the second conductive material having lower resistance.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this invention provided they fall within the scope of the following claims and their equivalents.

What is claimed is:

1. A semiconductor device comprising:

a stack comprising a plurality of insulating layers and a plurality of conductive layers alternately arranged, each of the conductive layers comprising a center portion and a plurality of edge portions at edges of the center portion, wherein a resistance of a material of the edge portions is less than a resistance of a material of the center portion; and a plurality of vertical pillar structures disposed in the stack, each of the vertical pillar structures comprising a conductive core, a shell electrode on a sidewall of the conductive core, and an ovonic threshold switch (OTS) layer on a sidewall of the shell electrode.

2. The semiconductor device of claim 1, wherein the center portions are conductive and are directly in contact with the OTS layers of the vertical pillar structures.

3. The semiconductor device of claim 1, wherein each of the center portions continuously extends between the vertical pillar structures.

4. The semiconductor device of claim 1, wherein the material of the center portions comprises TiN, carbon, graphene, doped carbon, W, WN, or TaN.

5. The semiconductor device of claim 1, wherein the material of the edge portions comprises TiN, TaN, Co, $CoSi_x$, Ni, $NiSi_x$, Ru, W, WN, or combinations thereof.

6. The semiconductor device of claim 1, wherein a resistance of a material of the conductive core is less than a resistance of a material of the shell electrode.

7. The semiconductor device of claim 6, wherein the material of the shell electrode comprises TiN, carbon, graphene, doped carbon, W, WN, or TaN.

8. The semiconductor device of claim 6, wherein the material of the conductive core comprises TiN, W, Al, Cu, TaN, Ru, Co, or combinations thereof.

9. The semiconductor device of claim 1, wherein a sidewall of each of the OTS layer is directly and continuously in contact with side surfaces of the insulating layers and the center portions of the conductive layers.

10. The semiconductor device of claim 1, wherein the stack comprises an array region and a stair case region extended from the array region, and lengths of the conductive layers and the underlying insulating layers are sequentially decrease from bottom to top at the stair case region in a first direction.

11. The semiconductor device of claim 10, wherein the edge portions extend in the first direction at opposite sides of the center portion of each of the conductive layers.

12. The semiconductor device of claim 10, further comprising:

a plurality of landing pad portions formed on the conductive layers at the stair case region; and a plurality of dielectric spacers laterally isolating the adjacent landing pad portions and the conductive layers.

13. The semiconductor device of claim 12, further comprising a plurality of contacts connected to the landing pad portions.

14. The semiconductor device of claim 1, wherein the edge portions encircle the center portion.

15. The semiconductor device of claim 1, wherein the edge portions further extends into the center portion.

16. A method of forming a semiconductor device, the method comprising following steps:

forming a stack comprising a plurality of insulating layers and a plurality of first conductive material layers alternately arranged;

forming a vertical pillar structure in an array region of the stack, the vertical pillar structure comprising a conductive core, a shell electrode on a sidewall of the conductive core, and an ovonic threshold switch (OTS) layer on a sidewall of the shell electrode;

forming edge portions with a second conductive material, the edge portions adjacent sidewalls of the first conductive material layers, wherein a resistance of the second conductive material is lower than a resistance of the first conductive material layers.

17. The method of claim 16, further comprising:

selectively growing a plurality of landing pad portions on the first conductive material layers at a stair case region of the stack; and forming a plurality contacts on the landing pad portions at the stair case region, respectively.

18. The method of claim 16, wherein a material of the first conductive material layers comprises TiN, carbon, graphene, doped carbon, W, WN, or TaN.

19. The method of claim 16, wherein the second conductive material comprises TiN, TaN, Co, $CoSi_x$, Ni, $NiSi_x$, Ru, W, WN, or combinations thereof.

20. The method of claim 16, further comprising removing protruding portions of the second conductive material such that side surfaces of remaining portions of the second conductive material align with side surfaces of the insulating layers.

* * * * *